(12) United States Patent
Rhodes

(10) Patent No.: US 7,038,259 B2
(45) Date of Patent: May 2, 2006

(54) DUAL CAPACITOR STRUCTURE FOR IMAGERS AND METHOD OF FORMATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/689,948

(22) Filed: Oct. 22, 2003

(65) Prior Publication Data
US 2005/0087780 A1 Apr. 28, 2005

(51) Int. Cl.
*H01L 29/80* (2006.01)

(52) U.S. Cl. ............... 257/258; 257/184; 257/222; 257/257; 257/291; 257/292; 257/298

(58) Field of Classification Search ........... 257/184, 257/187, 290–2, 296, 431–3, 461; 438/48, 438/69, 238
See application file for complete search history.

(56) References Cited

U.S. PATENT DOCUMENTS

| | | | |
|---|---|---|---|
| 4,413,188 A | | 11/1983 | Ozawa et al. |
| 5,654,565 A | * | 8/1997 | Hokari ............... 257/222 |
| 5,757,040 A | | 5/1998 | Saito et al. |
| 6,124,606 A | * | 9/2000 | den Boer et al. ......... 257/291 |
| 2002/0115252 A1 | | 8/2002 | Haukka et al. |
| 2002/0117690 A1 | | 8/2002 | Rhodes |

FOREIGN PATENT DOCUMENTS

WO WO 00/55919 9/2000

OTHER PUBLICATIONS

S. Simon Wong, et al.—"Electrical Reliability of Cu and Low-K Dielectric Integration," 1998 MRS Spring Meeting, Symposium E, Paper E7.1, San Francisco, CA, Apr. 16, 1998.
Nam Pham, et al.—"Design and Modeling Methodology for High-Performance Power Distribution Systems," DesignCon 2002 High-Performance System Design Conference.

* cited by examiner

*Primary Examiner*—Long Pham
*Assistant Examiner*—Wai-Sing Louie
(74) *Attorney, Agent, or Firm*—Dickstein Shapiro Morin & Oshinsky LLP

(57) ABSTRACT

CMOS and CCD imaging devices comprising different in-pixel capacitors and peripheral capacitors and methods of formation are disclosed. The capacitors used in periphery circuits have different requirements from the capacitors used in the pixel itself. Dual stack capacitors comprising two dielectric layers may be provided to achieve low leakage and high capacitance. A single masking step may be provided such that one region has a dual dielectric capacitor and a second region has a single dielectric capacitor. A different dielectric may also be provided in one region compared to another region wherein the inter-electrode insulator comprises a single dielectric in both regions.

23 Claims, 17 Drawing Sheets

_US 7,038,259 B2_

DUAL CAPACITOR STRUCTURE FOR IMAGERS AND METHOD OF FORMATION

FIELD OF THE INVENTION

The invention relates to capacitor structures for solid state imaging devices, including CMOS and CCD imaging devices.

BACKGROUND OF THE INVENTION

There are a number of different types of semiconductor-based imagers, including charge coupled devices (CCDs), photo diode arrays, charge injection devices and hybrid focal plane arrays. CCDs are often employed for image acquisition for small size imaging applications. However, CCD imagers suffer from a number of disadvantages. For example, they are susceptible to radiation damage, they exhibit destructive read out over time, they require good light shielding to avoid image smear and they have a high power dissipation for large arrays.

Because of the inherent limitations in CCD technology, there is an interest in CMOS imagers for possible use as low cost imaging devices. CMOS imagers have a number of advantages, including for example low voltage operation and low power consumption. CMOS imagers are also compatible with integrated on-chip electronics (control logic and timing, image processing, and signal conditioning such as A/D conversion); CMOS imagers allow random access to the image data, and have lower fabrication costs as compared with the conventional CCD since standard CMOS processing techniques can be used. A fully compatible CMOS sensor technology enabling a higher level of integration of an image array with associated processing circuits would be beneficial to many digital applications.

A CMOS imager circuit includes a focal plane array of pixel cells, each one of the cells including either a photo diode, a photogate or a photoconductor overlying a doped region of a substrate for accumulating photo-generated charge in the underlying portion of the substrate.

In a conventional CMOS imager, the active elements of a pixel cell perform the necessary functions of: (1) photon to charge conversion; (2) accumulation of image charge; (3) transfer of charge to a floating diffusion node accompanied by charge amplification; (4) resetting the floating diffusion node to a known state before the transfer of charge to it; (5) selection of a pixel for readout; and (6) output and amplification of a signal representing pixel charge. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

In CCD, CMOS and other types of imagers, capacitors are employed in conjunction with other device components for charge storage and/or in analog signal processing circuits. As a result of the inability of the capacitors to fully collect and store the electric charge collected by the photosensitive area, conventional imagers typically suffer from poor signal to noise ratios and poor dynamic range. Additionally, conventional imagers may also suffer from poor operation due to other factors that can affect capacitor function. For example, as P-channel devices in the peripheral area have different requirements from N-channel devices in the active area of a pixel cell, an active area capacitor may require a different capacitance (for example, a higher capacitance) than the capacitance of a capacitor formed on the peripheral area. Current technological processes fail to provide, however, an optimized process for the formation of active and peripheral area capacitors having different structural characteristics, which in turn entail different performance characteristics of the capacitors.

Accordingly, there are needed improved imagers and imaging devices, which provide for improved in-pixel capacitors and peripheral analog capacitors. Optimized methods of fabricating a pixel array exhibiting these improvements in capacitor function are also needed.

SUMMARY OF THE INVENTION

The present invention provides imaging devices comprising in-pixel and peripheral capacitors. The capacitors used in peripheral circuits have different requirements from the in-pixel or active capacitors. In one embodiment, dual stack capacitors comprising two dielectric layers may be provided in both the active pixel area and the peripheral area to achieve low leakage and high capacitance. In another embodiment, a dual dielectric capacitor may be provided in one of the active or the peripheral areas, and a single dielectric capacitor is provided in the other of the active or peripheral areas. In yet another embodiment, a single dielectric capacitor is provided in both the active and the peripheral areas, but the dielectric of the active area is different from the dielectric of the peripheral area. The invention also provides methods of forming such capacitor structures.

These and other features and advantages of the invention will be more apparent from the following detailed description that is provided in connection with the accompanying drawings and illustrated exemplary embodiments of the invention.

DETAILED DESCRIPTION OF THE INVENTION

Figure 1:
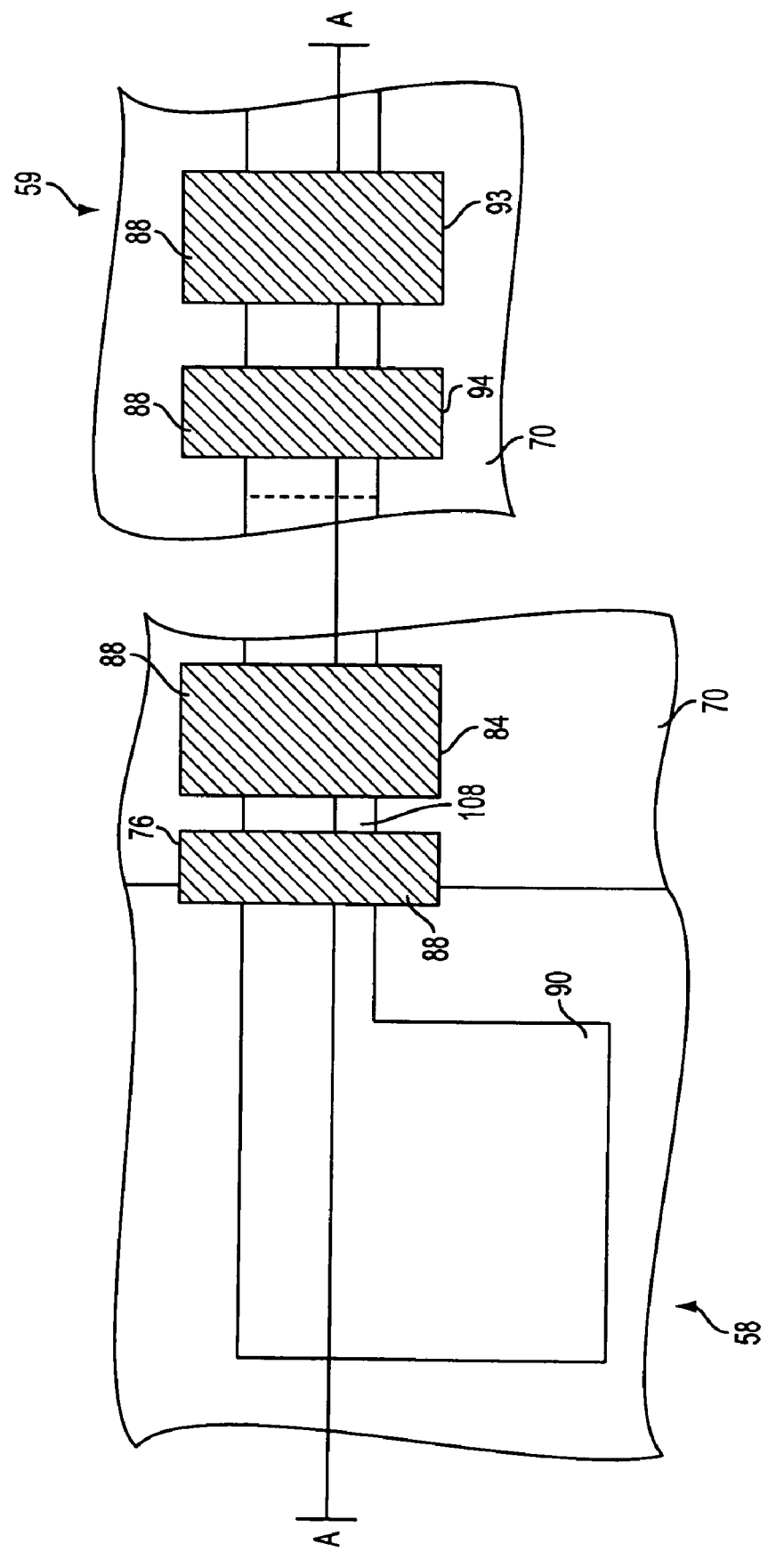
FIG. 1 is a top view of portions of a CMOS imager integrated circuit according to a first exemplary embodiment of the invention.

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure. The structure should be understood to include silicon, silicon-on insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The term "pixel" refers to a discrete picture element unit cell containing a photoconductor and transistors for converting electromagnetic radiation to an electrical signal. For purposes of illustration, a representative pixel according to one embodiment of the invention is illustrated in the figures and description herein. An array or combination of pixels together may comprise a photoconductor array for use in a CMOS or CCD imager device. Typically, fabrication of all pixels of a photoconductor array will proceed simultaneously in a similar fashion.

Referring now to the drawings, where like elements are designated by like reference numerals, FIGS. 1–16 illustrate methods for improving the performance of capacitors in CMOS and CCD imaging devices conducted in accordance with embodiments of the present invention. The break symbol (\\) in FIGS. 2–14 represents a spatial separation between pixel array region 58 with N-channel transistors and P-channel devices in the peripheral region 59.

FIGS. 1–5 illustrate a first embodiment of the present invention, according to which capacitors 84, 93 (FIGS. 1, 5) are formed in active area and peripheral area, respectively, of semiconductor substrate 70. Portions of pixel region 58 and peripheral region 59 are formed in semiconductor substrate 70 at a surface of which a CMOS imager integrated circuit may be fabricated. The CMOS fabrication process begins with a lightly-doped P-type or N-type silicon substrate, for example, or lightly-doped epitaxial silicon on a heavily doped substrate. Pixel region 58 of substrate 70 includes components of a pixel cell circuitry within an array of pixels, while peripheral portion 59 includes representative components formed at the periphery of the array, and employed for timing and control or readout of signals from pixel cells. Source/drain regions (not shown) may be implanted into substrate 70 using any suitable method, including ion implantation, to form lightly doped or heavily doped source/drain regions.

FIG. 1 also illustrates transistors 76, 94 and capacitors 84, 93 which are formed in the active pixel region 58 and in the peripheral region 59. Transistors 76, 94 and capacitors 84, 93 each comprise a layer of insulating material 88. Insulating material 88 may be a layer of tetraethyl orthosilicate (TEOS) formed by conventional deposition processes, for example thermal oxidation or chemical vapor deposition (CVD). Insulating material 88 may be optionally formed as a nitride, oxide, ON (oxide-nitride), NO (nitride-oxide), ONO (oxide-nitride-oxide), or other insulating material.

FIG. 1 also illustrates a photosensor 90 in the pixel region 58. Photosensor 90 may be formed as a photodiode for accumulating photo-generated charge in an underlying portion of the substrate, as depicted in FIGS. 1–9. Photosensor 90 may include, for example, a photosensitive p-n-p junction region formed at or beneath the upper surface of substrate 70 by conventional techniques. It should be understood that the imagers of the invention may include a photogate, photoconductor, or other image to charge converting device, in lieu of a photodiode, as the initial accumulator for photo-generated charge. Photosensor 90 may be formed at or beneath the upper surface of substrate 70, and may also be constructed in any arrangement, orientation, shape and geometry, to be integrated with other components of a semiconductor device.

Although not depicted in FIG. 1, pixel region 58 may comprise other N-channel devices (not shown), and peripheral region 59 may comprise other P-channel devices (not shown). For example, pixel region 58 may include N-channel transistors controlled by a transfer gate and reset gate (not shown), each formed by depositing and patterning a polysilicon stack. The polysilicon stack can be formed, for example, by depositing and patterning a layer of gate oxide, a layer of doped polysilicon, and a layer of oxide or nitride.

Figure 2:
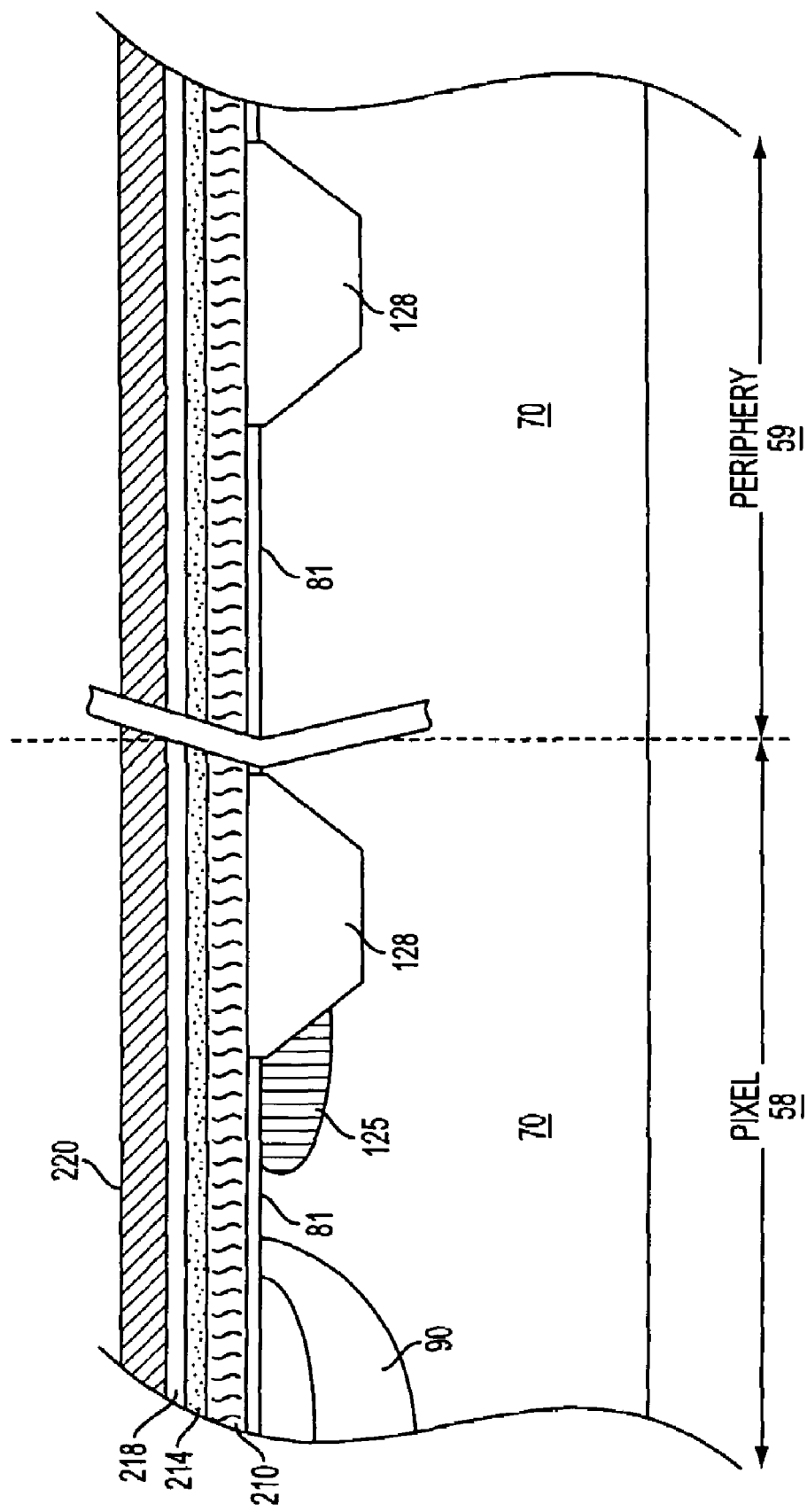
FIG. 2 is a schematic cross-sectional view of the structure of FIG. 1 taken along line A—A and at an initial stage of processing.

Reference is now made to FIG. 2, which illustrates a cross-sectional view of the CMOS image sensor of FIG. 1, taken along line A—A and after initial processing, but prior to formation of transistors 76, 94 and capacitors 84, 93 in the pixel region 58 and in the periphery region 59. For exemplary purposes, the substrate 70 may be a silicon substrate and may include a surface oxide layer, treated herein as part of one substrate. However, as noted above, the invention has equal application to other semiconductor substrates.

FIG. 2 also illustrates trench isolation regions 128 formed in the substrate 70 by a conventional process. For example, the trench isolation regions 128 may be formed by an STI process, according to which trenches are first tched in the doped active layer or substrate 70 via a directional etching process, such as Reactive Ion Etching (RIE), or with a preferential anisotropic etchant used to etch into the substrate 70 to a sufficient depth, generally about 1000 Å to 5000 Å. The trenches are then filled with an insulating material, for example, silicon dioxide, silicon nitride, ON (oxide-nitride), NO (nitride-oxide), or ONO (oxide-nitride-oxide). The insulating materials may be formed by various chemical vapor deposition (CVD) techniques such as low pressure chemical vapor deposition (LPCVD), high density plasma (HDP) deposition, or any other suitable method for depositing an insulating material within a trench. While the trench isolation regions 128 may be formed by an STI process, it should be understood that the isolation regions 128 may instead be formed using a Local Oxidation of Silicon (LOCOS) process.

Also illustrated in FIG. 2 is floating diffusion region 125 formed in the substrate 70 and acting as a sensing node. A transfer gate (not shown) transfers photoelectric charges generated in photosensor 90 to floating diffusion region 125. Trench isolation regions 128 and diffusion regions 125 may also be doped after various fabrication steps via a masked ion implantation.

Referring still to FIG. 2, a gate oxide layer 81 is formed over the surface of substrate 70. A first electrode layer 210 is subsequently formed over gate oxide layer 81 and trench isolation regions 128. Electrode layer 210 may be formed of any suitable electrode material, including but not limited to poly, poly/WSi, poly/WN/W, and poly/silicide. Electrode layer 210 may optionally be planarized after formation, using any suitable planarizing technique.

Dielectric layers 214 and 218 are then consecutively formed over electrode layer 210, as also shown in FIG. 2. Dielectric layers 214 and 218 each may be formed of an oxide, metal oxide, $HfO_x$, nitride, $Al_2O_3$, $Ta_2O_5$, or BST material, or any other nonconductor of direct electric current. Electrode layer 220 is then formed over dielectric layer 218. Electrode layer 220 may be formed of any suitable electrode material, including but not limited to polysilicon, poly/$TiSi_2$, poly/$WSi_2$, poly/$WN_x$/W, poly/$WN_x$, poly/$CoSi_2$ and poly/$MoSi_2$. Electrode layers 210 and 220 each may be formed to any suitable thickness, for example from about 50 Angstroms to about 1,000 Angstroms. Layers 210, 214, 218 and 220 each may be deposited by any suitable technique, including chemical vapor deposition (CVD) techniques such as low pressure chemical vapor deposition (LPCVD) or high density plasma (HDP) deposition. Dielectrics used in the invention may each be formed to any suitable thickness, for example from about 10 Angstroms to about 500 Angstroms, and with any desired shape and geometry.

Figure 3:
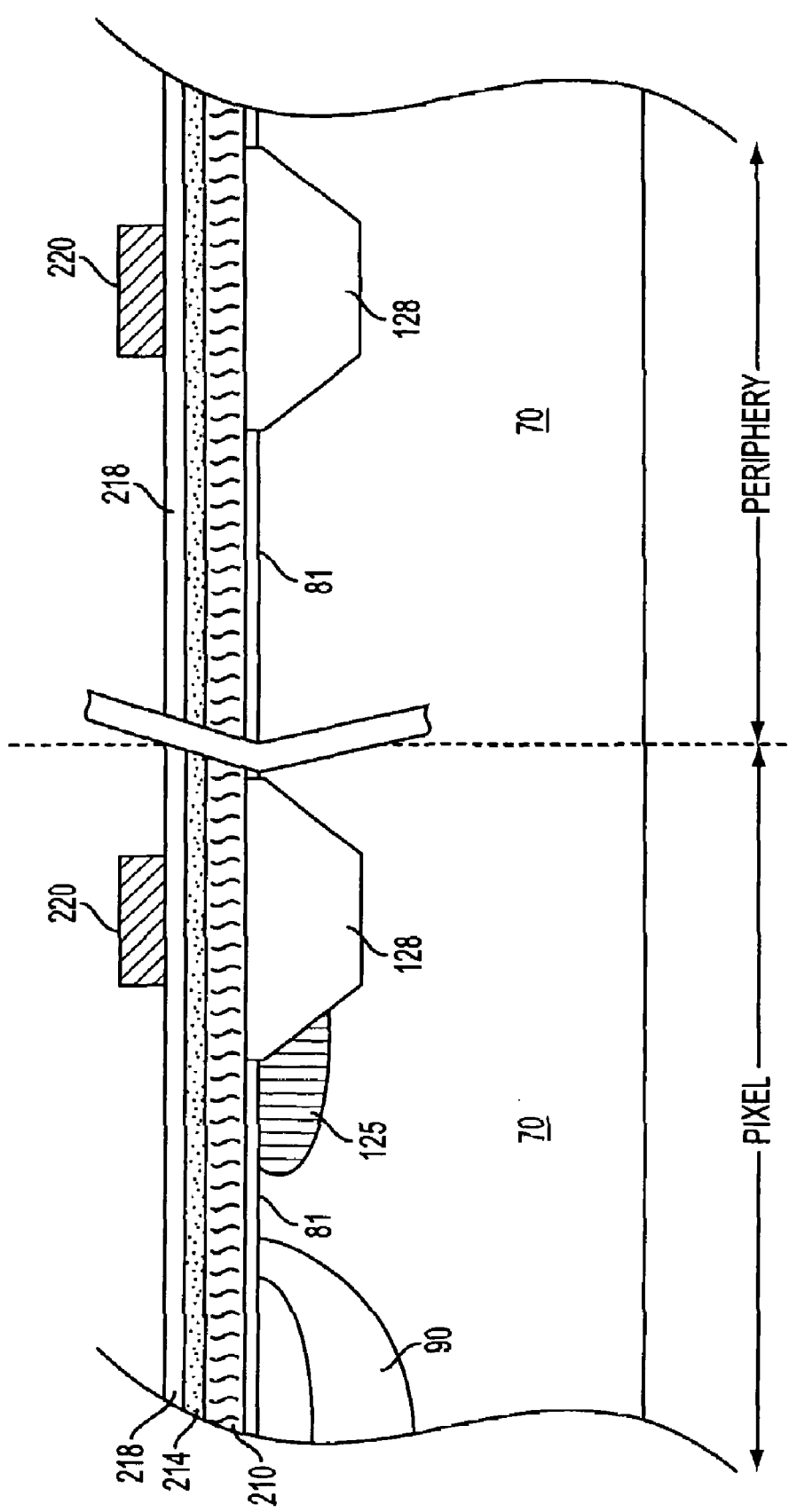
FIG. 3 is a schematic cross-sectional view of the structure of FIG. 1 at a stage of processing subsequent to that shown in FIG. 2.

FIG. 3 illustrates a stage of processing subsequent to that shown in FIG. 2 and, in particular, the patterning of the electrode layer 220. Although electrode layer 220 is shown in FIG. 3 patterned with generally straight sidewalls above layers 210, 214, 218 and trench isolation regions 128, electrode layer 220 may optionally be patterned with any other suitable shape and geometry.

Figure 4:
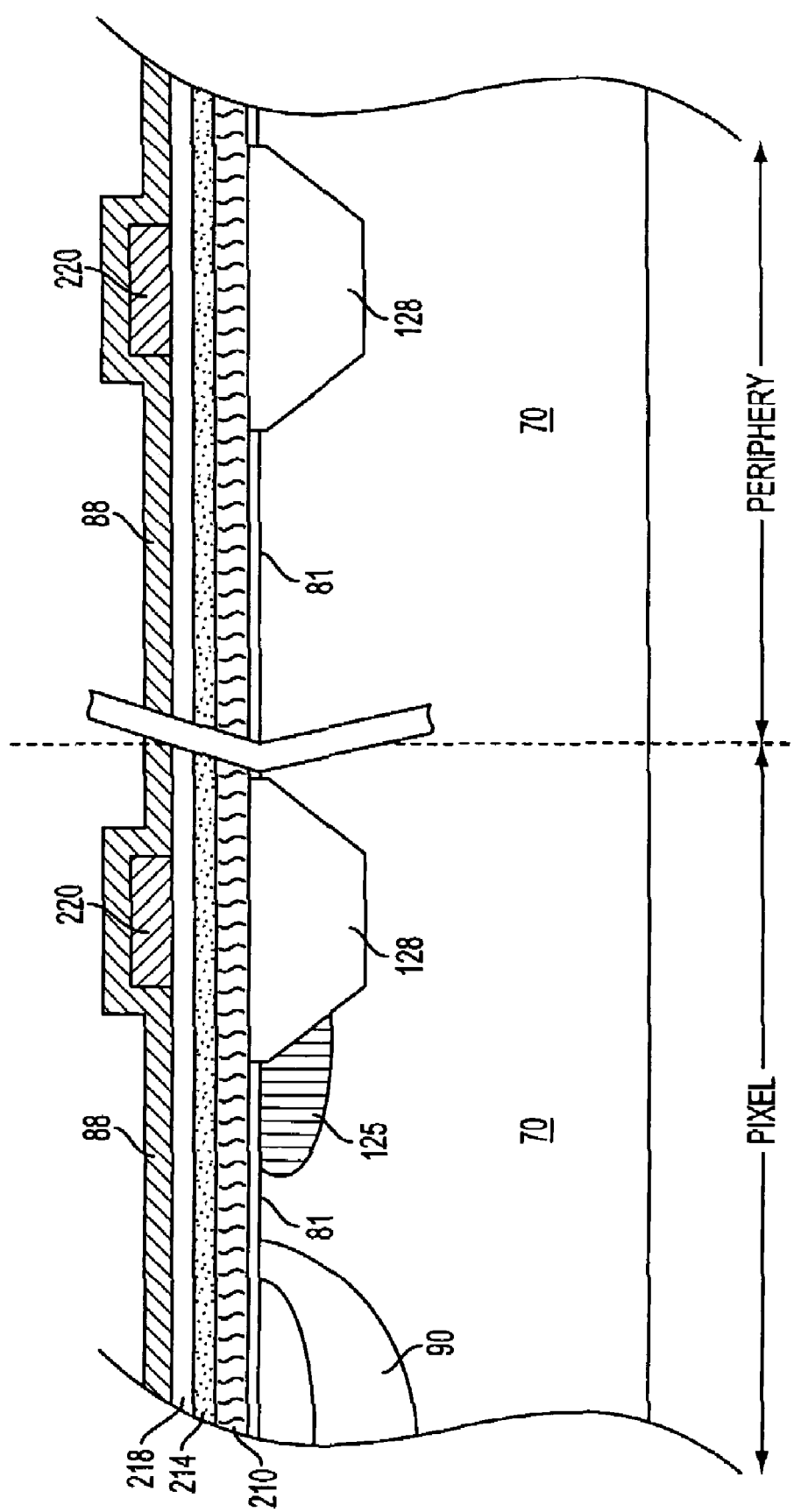
FIG. 4 is a schematic cross-sectional view of the structure of FIG. 1 at a stage of processing subsequent to that shown in FIG. 3.

Referring now to FIG. 4, insulating layer 88 is formed to cover patterned electrodes 220 as well as dielectric layer 218. Insulating layer 88 may be a layer of tetraethyl orthosilicate (TEOS) formed by conventional deposition processes, for example thermal oxidation or chemical vapor deposition (CVD). Insulating layer 88 may optionally be formed as a nitride, oxide, ON (oxide-nitride), NO (nitride-oxide), ONO (oxide-nitride-oxide), or other insulating material. Insulating layer 88 may also be formed with any desired thickness, and may be optionally planarized after formation.

Figure 5:
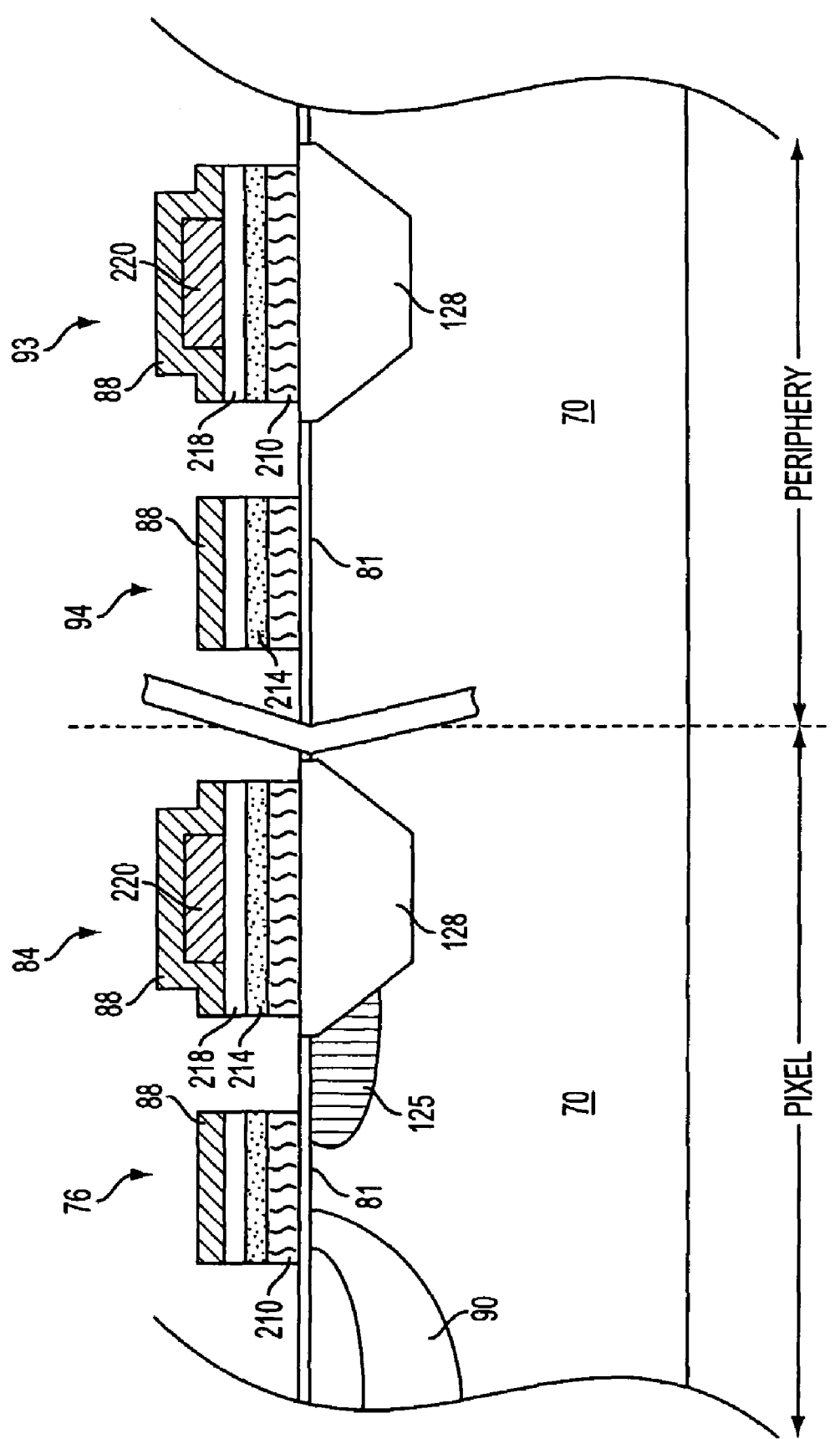
FIG. 5 is a schematic cross-sectional view of the structure of FIG. 1 at a stage of processing subsequent to that shown in FIG. 4.

Subsequent to the formation of the insulating layer 88 of FIG. 4, pixel transistor 76, pixel capacitor 84, periphery transistor 94, and periphery capacitor 93 are formed by patterning and etching portions of layers 210, 214, 218 and insulating layer 88, as shown in FIG. 5. The order of the process steps for transistor and capacitor formation may be varied as is required or convenient for a particular process flow. For example, the gate stacks may be formed before, or after, or in between the steps for forming the capacitors. The dual stack capacitors 84, 93 consisting of dielectrics 214, 218 shown in FIG. 5 provide low leakage and high capacitance.

An elevated-temperature drive step may also be conducted, after which the N and P-channel devices shown in FIG. 5 are fully formed. Additionally, the structures shown in FIG. 5 may be covered with a number of translucent or transparent insulating and passivation layers (not shown) formed over the image device. Such insulating and passivation layers may include $SiO_2$, TEOS, BPSG, nitride, PSG, BSG, or SOG which can be planarized. Conventional processing steps may also be carried out to form, for example, contacts in the insulating layers to provide electrical connection with implanted source/drain regions and other wiring to connect gate lines and other connections in the pixel. Other conventional processing steps may also be carried out to complete the formation of additional components, for example, filters and lenses. The order of the process steps may be varied as is required or convenient for a particular process flow.

Figure 6:
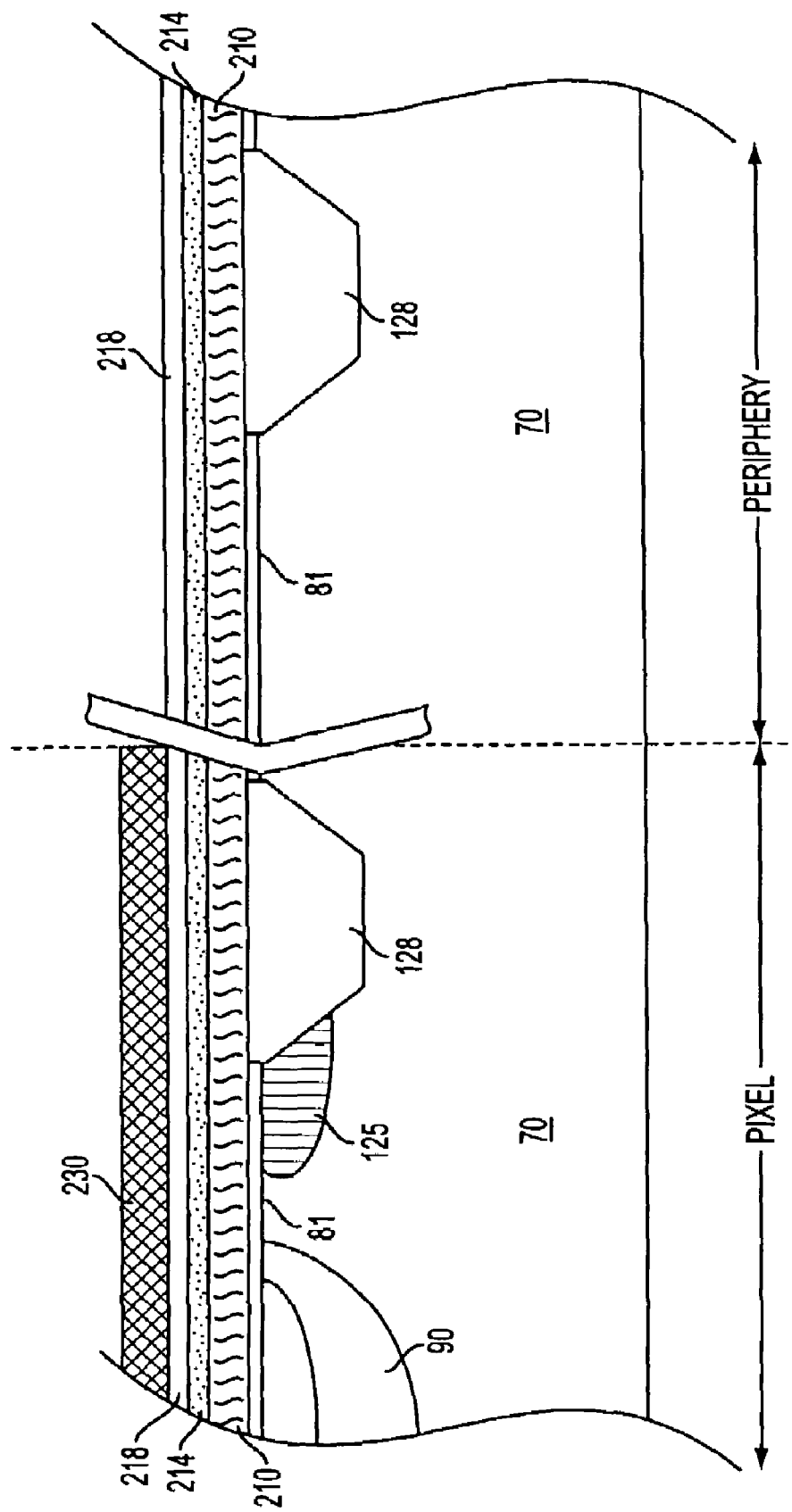
FIG. 6 is a schematic cross-sectional view of a CMOS imager integrated circuit according to a second exemplary embodiment of the invention.

FIGS. 6–9 illustrate a second exemplary embodiment for the formation of in-pixel capacitor 184 (FIG. 9) and peripheral capacitor 193 (FIG. 9) in accordance with the present invention. FIG. 6 depicts an IC device after initial processing, but prior to formation of transistors 176, 194 and capacitors 184, 193 in the pixel region 58 and in the periphery region 59 of FIG. 9. The structure of FIG. 6 is similar in part to that of FIG. 2, to the extent that both structures comprise the first electrode layer 210 and the two dielectric layers 214, 218; the structure of FIG. 6 differs, however, from the structure of FIG. 2 in that a photoresist layer 230 (FIG. 6) is formed in lieu of the electrode layer 220 (FIG. 2).

Figure 7:
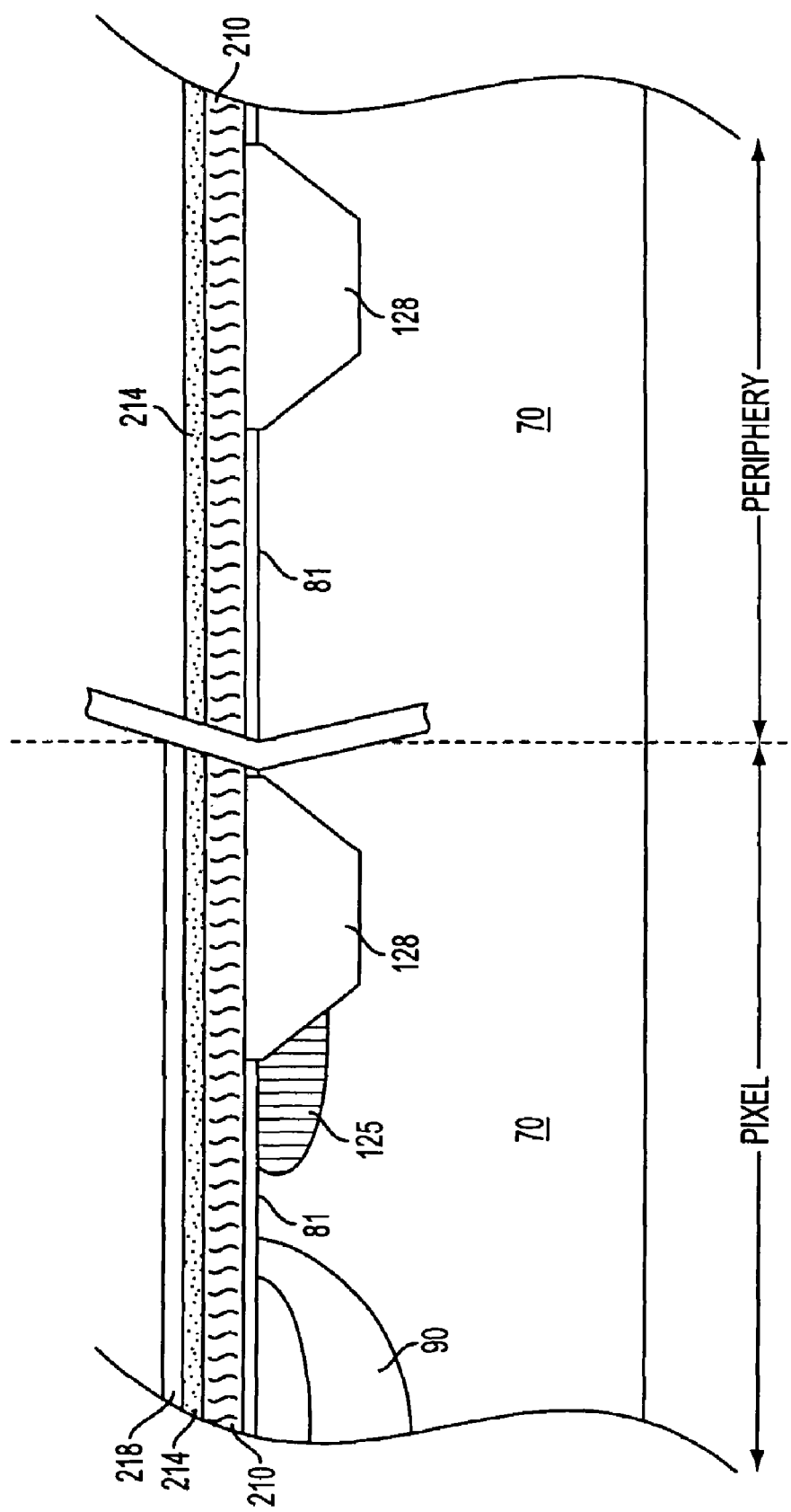
FIG. 7 is a schematic cross-sectional view of the structure of FIG. 6 at a stage of processing subsequent to that shown in FIG. 6.

The photoresist layer 230 is formed over and in contact with the dielectric layer 218 to allow patterning of the dielectric layer 218 in the peripheral region 59, as illustrated in FIG. 6. After selective etching and removal of the exposed portion of dielectric layer 218 in the periphery 59, and stripping of photoresist layer 230, the resulting structure is shown in FIG. 7. In this manner, the pixel region 58 of FIG. 7 comprises two dielectric layers 214, 218 whereas only the single dielectric layer 214 remains in the periphery region 59. As in the previous embodiment, electrode layer 210 may be formed of any suitable electrode material, including but not limited to poly, poly/WSi, poly/WN/W, and poly/silicide. Dielectric layers 214 and 218 each may be formed of an oxide, metal oxide, $HfO_x$, nitride, $Al_2O_3$, $Ta_2O_5$, or BST material, or any other nonconductor of direct electric current. Layers 210, 214, 218 may be deposited by any suitable technique, including chemical vapor deposition (CVD), low pressure chemical vapor deposition (LPCVD) or high density plasma (HDP) deposition.

Figure 8:
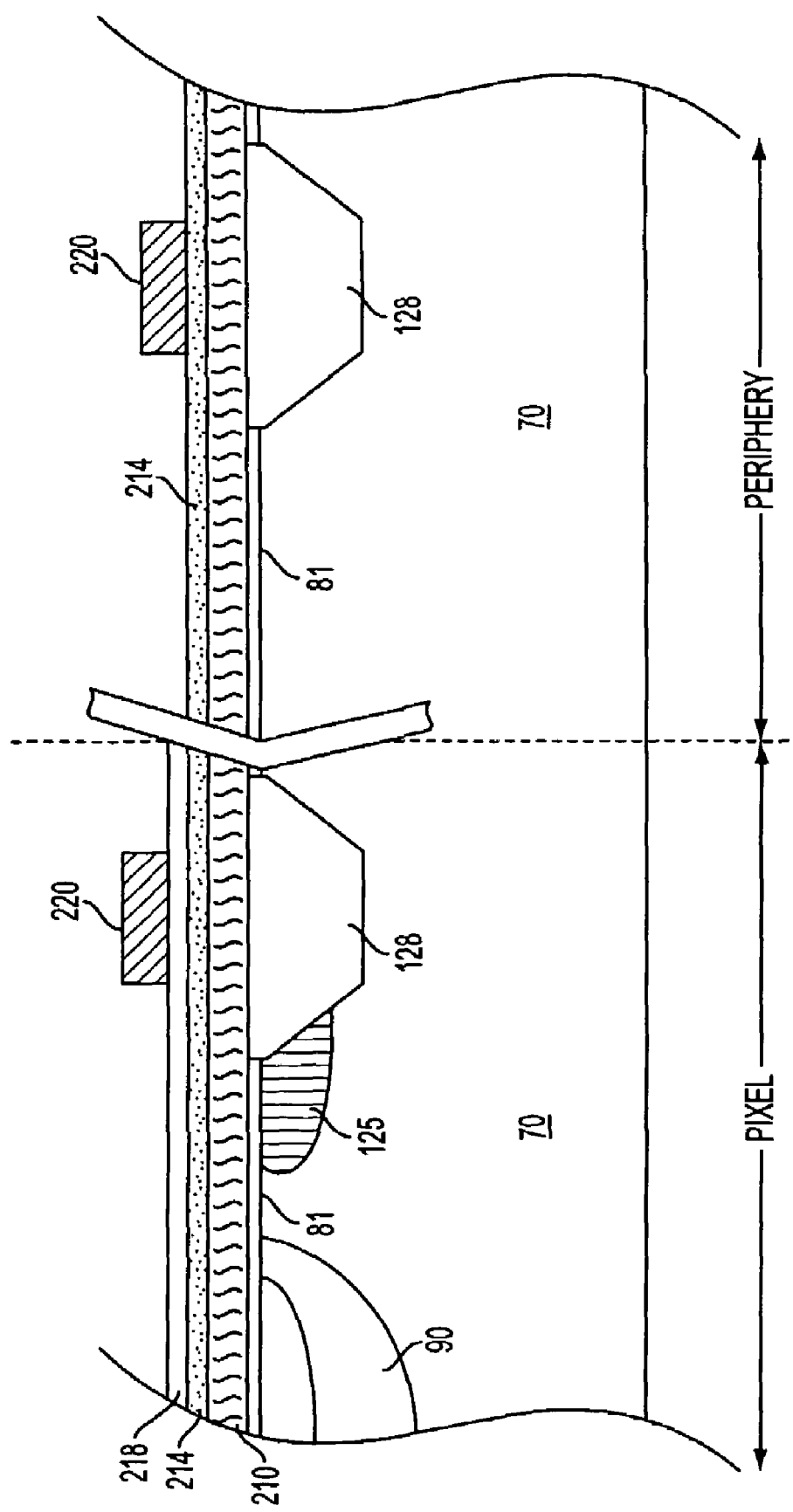
FIG. 8 is a schematic cross-sectional view of the structure of FIG. 6 at a stage of processing subsequent to that shown in FIG. 7.

FIG. 8 illustrates a stage of processing subsequent to that shown in FIG. 7. Subsequent to the patterning of the dielectric layer 218, electrode layer 220 of FIG. 8 is deposited and patterned over dielectric layer 218 in the pixel region 58 and over dielectric layer 214 in the periphery 59. As in the previously-described embodiment, electrode layer 220 may be formed of any suitable electrode material, including but not limited to polysilicon, poly/TiSi$_2$, poly/WSi$_2$, poly/WN$_x$/W, poly/WN$_x$, poly/CoSi$_2$ and poly/MoSi$_2$. Layers 210, 214, 218 and 220 may be deposited by any suitable technique, including chemical vapor deposition (CVD) techniques such as low pressure chemical vapor deposition (LPCVD) or high density plasma (HDP) deposition. Electrode layer 220 is shown patterned with generally straight sidewalls above layers 214 and 218; however, electrode layer 220 may be patterned with any other suitable shape and geometry.

Figure 9:
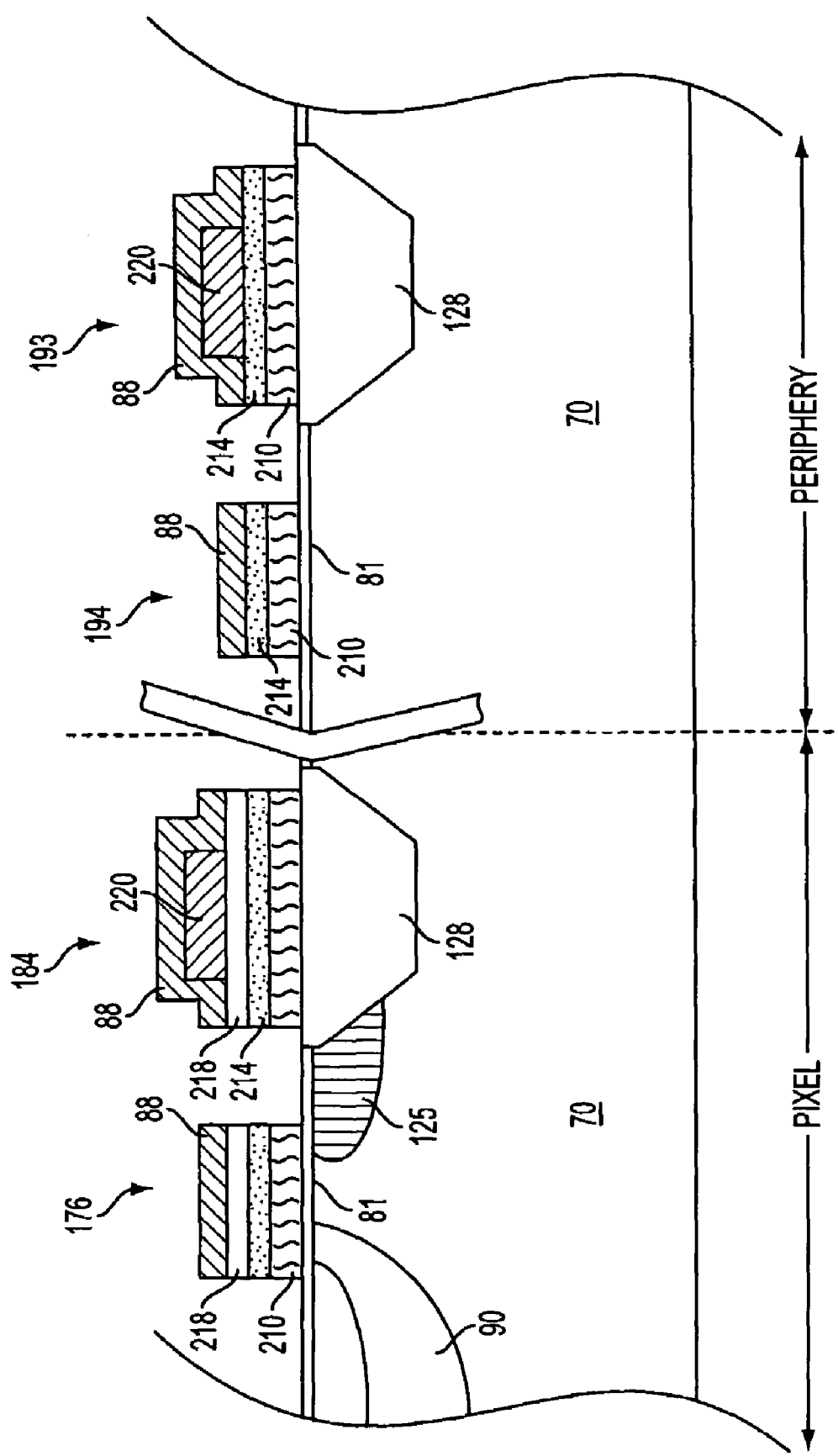
FIG. 9 is a schematic cross-sectional view of the structure of FIG. 6 at a stage of processing subsequent to that shown in FIG. 8.

FIG. 9 illustrates a stage of processing subsequent to that shown in FIG. 8. Insulating layer 88, for example, a layer of tetraethyl orthosilicate (TEOS), is formed to cover patterned electrodes 220 as well as dielectric layers 214, 218. After selective etching and patterning of layers 210, 214, 218 and insulating layer 88, the resulting pixel transistor 176, pixel capacitor 184, periphery transistor 194, and periphery capacitor 193 are formed, as shown in FIG. 9. The periphery capacitor 193 comprises a single dielectric 214, whereas the in-pixel capacitor 184 comprises two dielectrics 214, 218. Alternatively, the periphery capacitor may be formed comprising two or more dielectrics and the pixel capacitor comprising a single dielectric.

An elevated-temperature drive step may also be performed, after which the N and P-channel devices shown in FIG. 9 are fully formed. The structures shown in FIG. 9 may also be covered with a number of translucent or transparent insulating and passivation layers (not shown) formed over the image device. Such insulating and passivation layers may include SiO$_2$, TEOS, BPSG, nitride, PSG, BSG, or SOG which can be planarized. Conventional processing steps may also be carried out to form, for example, contacts in the insulating layers to provide electrical connection with implanted source/drain regions and other wiring to connect gate lines and other connections in the pixel.

Figure 10:
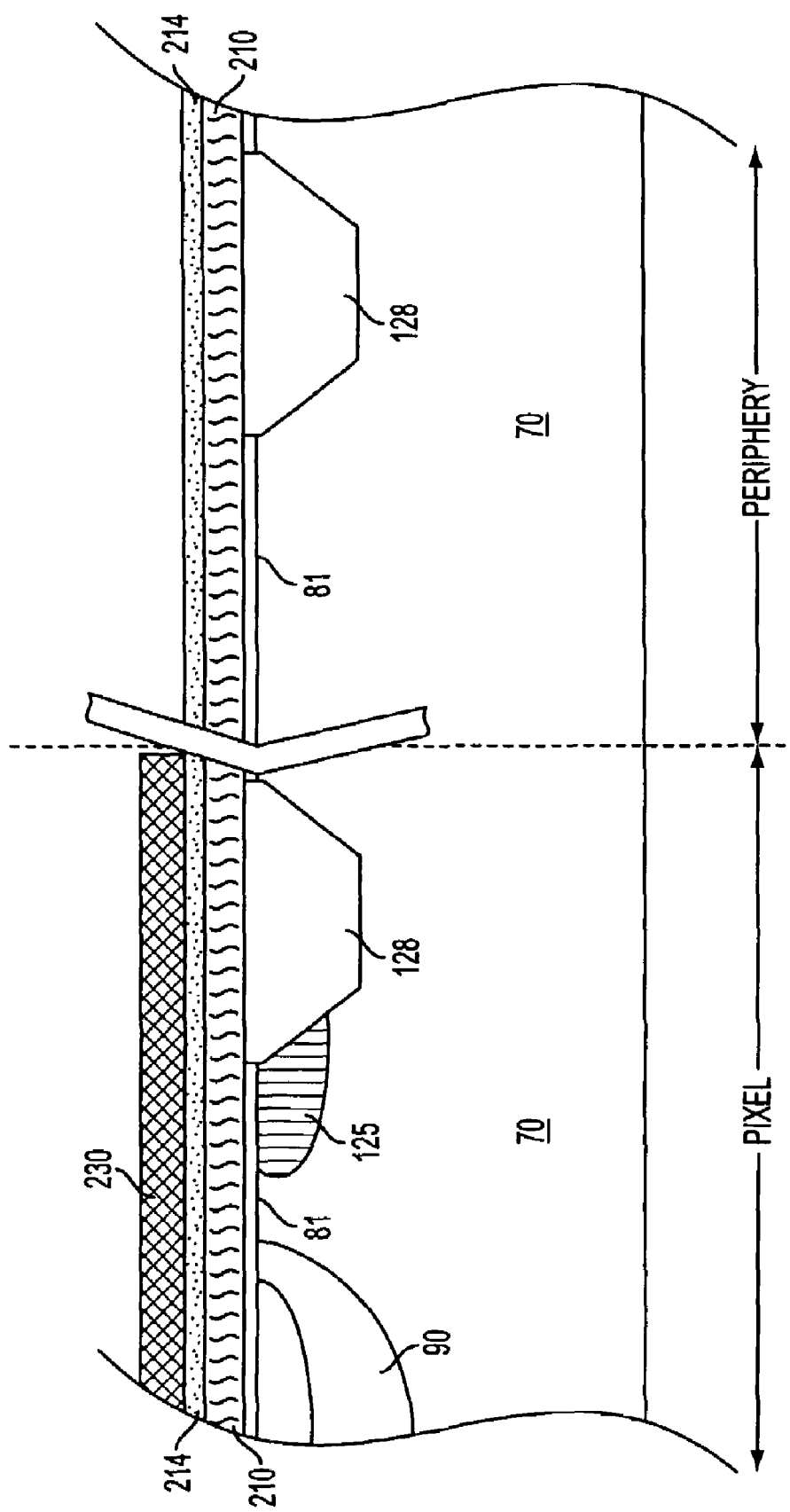
FIG. 10 a schematic cross-sectional view of a CMOS imager integrated circuit according to a third exemplary embodiment of the invention.

FIGS. 10–14 illustrate yet a third exemplary embodiment of the invention for the construction of in-pixel capacitor 284 (FIG. 14) and peripheral capacitor 293 (FIG. 14) in the pixel region 58 and in the periphery 59. FIG. 10 depicts an IC device after initial processing, but prior to formation of transistors 276, 294 and capacitors 284, 293 of FIG. 14. The structure of FIG. 10 is similar in part to that of FIG. 6, to the extent that both structures comprise first electrode layer 210 and the first dielectric layer 214 formed over and in contact with the first electrode layer 210; the structure of FIG. 10 differs, however, from the structure of FIG. 6 in that only one dielectric layer is employed in FIG. 10 and, thus, the photoresist layer 230 (FIG. 10) is formed directly over, and in contact with, the first dielectric layer 214.

Figure 11:
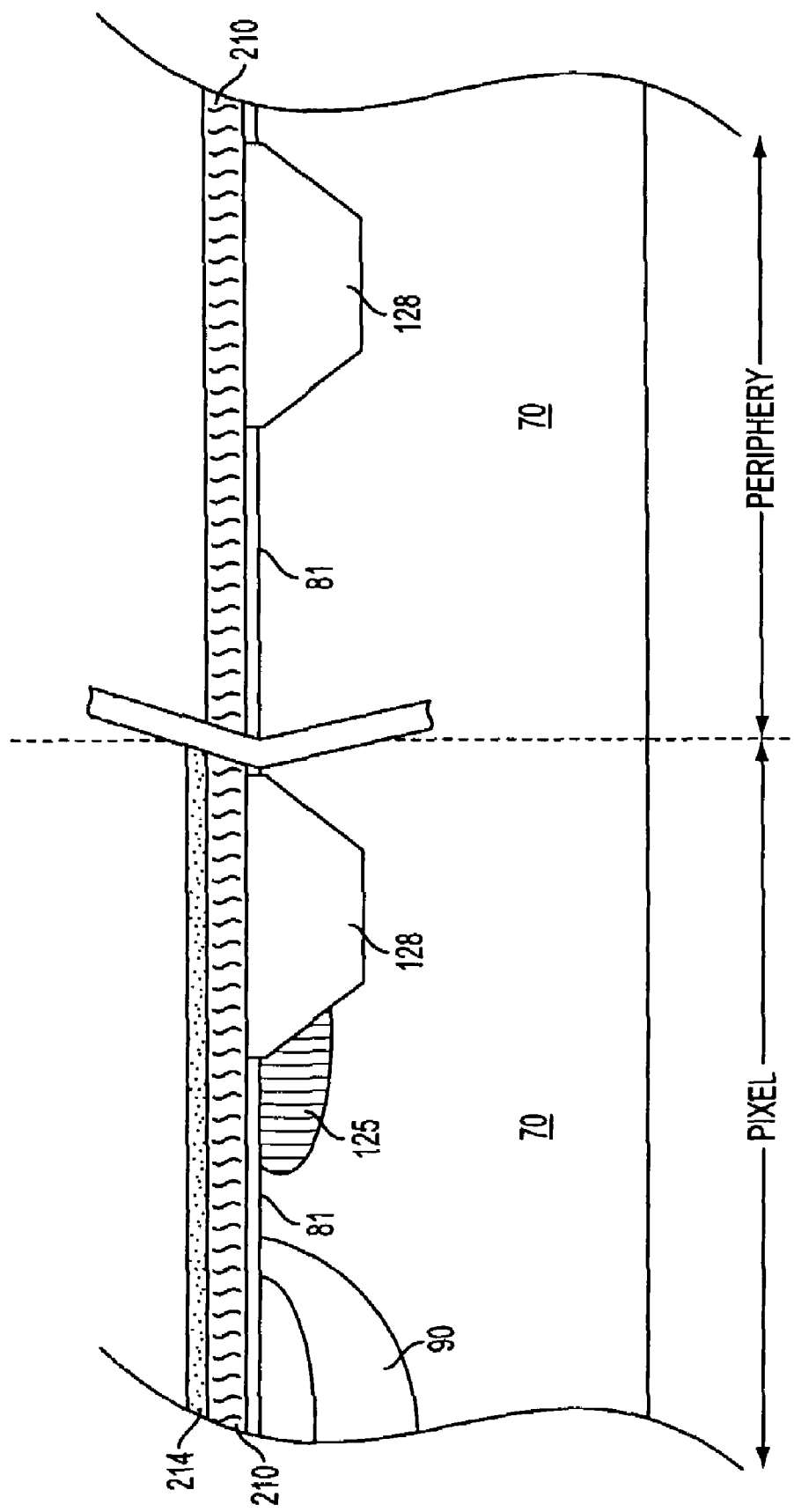
FIG. 11 is a schematic cross-sectional view of the structure of FIG. 10 at a stage of processing subsequent to that shown in FIG. 10.

As in the previously described embodiments, trench isolation regions 128 and floating diffusion region 125 are formed in the substrate 70, as shown in FIG. 10. Gate oxide layer 81 is formed over the surface of substrate 70 and a first electrode layer 210 is then formed over gate oxide layer 81 and trench isolation regions 128. Electrode layer 210 may be formed of any suitable electrode material, including but not limited to poly, poly/WSi, poly/WN/W, and poly/silicide. Dielectric layer 214 is subsequently formed over electrode layer 210 by any suitable technique, including CVD, LPCVD or HDP deposition. Dielectric layer 214 may be formed of an oxide, metal oxide, HfO$_x$, nitride, Al$_2$O$_3$, Ta$_2$O$_5$, or BST material, or any other nonconductor of direct electric current. A layer of photoresist 230 is then deposited for patterning of the dielectric layer 214 in the peripheral region 59, as also shown in FIG. 10. After selective etching and removal of the exposed portion of dielectric layer 214 in the periphery 59, the resulting structure is shown in FIG. 11. The resist layer 230 has been stripped using an oxygen-containing plasma.

Figure 12A:
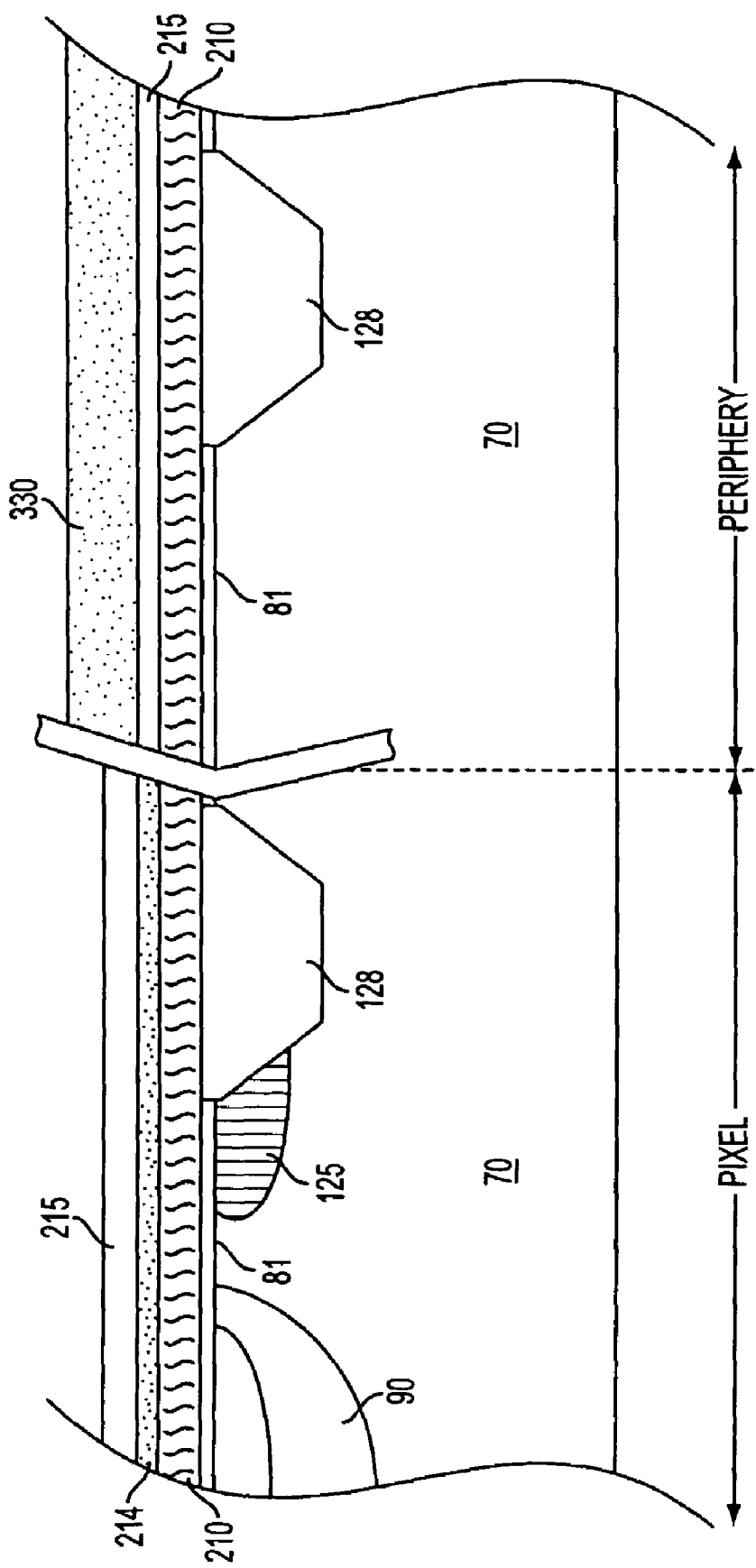
FIG. 12(a) is a schematic cross-sectional view of the structure of FIG. 10 at a stage of processing subsequent to that shown in FIG. 11.

As shown in FIG. 12(a), a second dielectric layer 215 is deposited on both the periphery and array. Dielectric layer 215 may be formed of an oxide, nitride, metal oxide, Al$_2$O$_3$, Ta$_2$O$_3$, BST, HfO$_x$, or any other insulator. This dielectric layer may be deposited by any suitable technique such as CVD, LDCVD, or HDP but not limited to these deposition methods. Dielectric 215 is different from dielectric 214. Also shown in FIG. 12(a) is another photoresist layer 330 which covers at least one periphery capacitor region.

Alternatively, the process steps may be modified such that a dielectric is first applied in the periphery 59, with appropriate masking steps, followed by deposition of a different dielectric in pixel region 58.

Figure 12B:
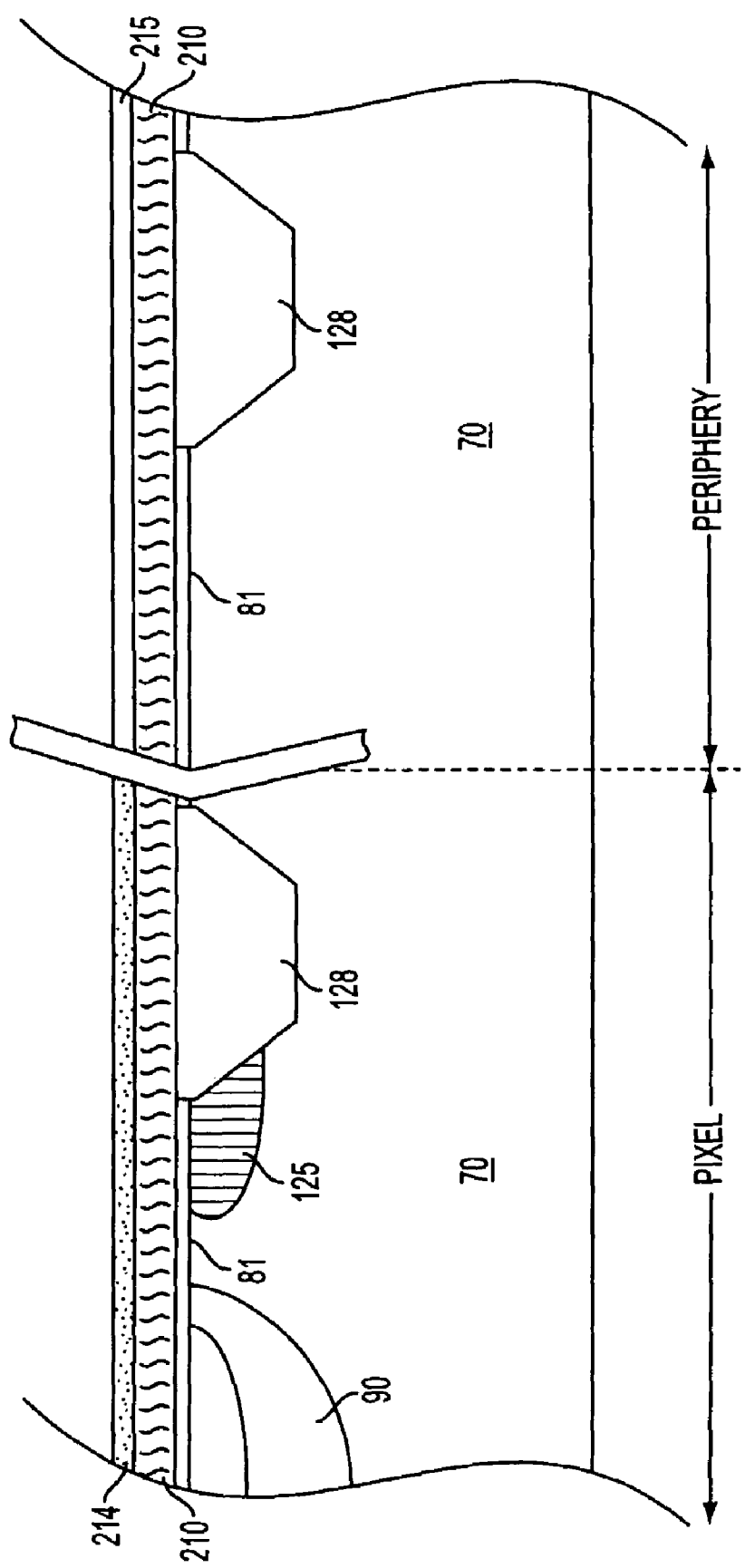
FIG. 12(b) is a schematic cross-sectional view of the structure of FIG. 10 at a stage of processing subsequent to that shown in FIG. 12(a).

Reference is now made to FIG. 12(b). In FIG. 12(b), the dielectric layer 215 has been removed from the pixel region using a selective etch which may be a wet or a dry etch. The dielectric 215 in the periphery region is protected by the photoresist layer 330 and is not removed. After the selective etch, the photoresist layer 330 is removed using an oxygen containing plasma.

Figure 13:
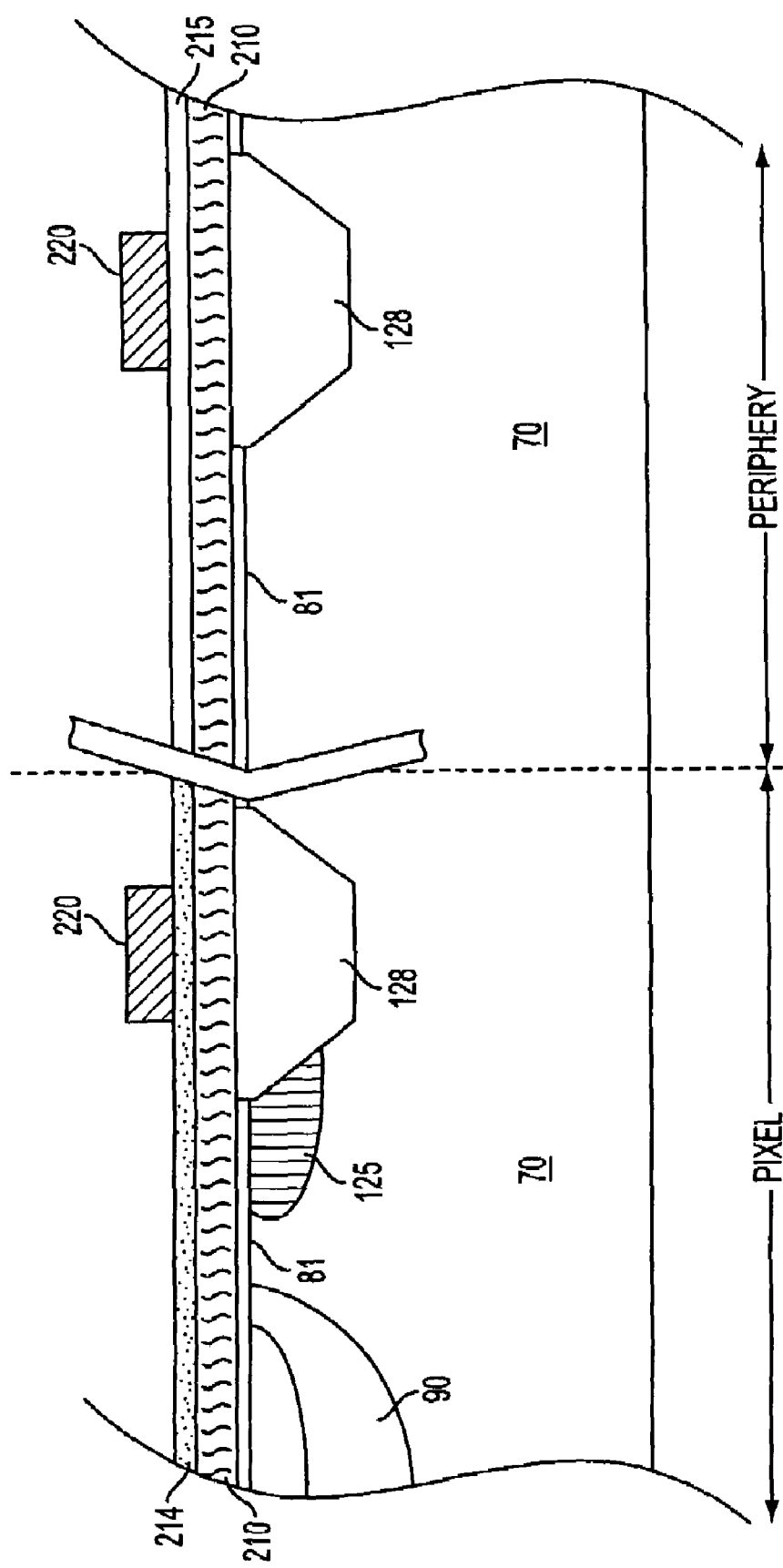
FIG. 13 is a schematic cross-sectional view of the structure of FIG. 10 at a stage of processing subsequent to that shown in FIG. 12(b).

Reference is now made to FIG. 13. Electrode layer 220 is deposited and patterned over dielectric layer 214 in the pixel region 58 and over dielectric layer 215 in the periphery 59. Electrode layer 220 may be formed of any suitable electrode material, including but not limited to polysilicon, poly/TiSi$_2$, poly/WSi$_2$, poly/WN$_x$/W, poly/WN$_x$, poly/CoSi$_2$ and poly/MoSi$_2$. As in the previously described embodiments, insulating layer 88 is subsequently formed to cover patterned electrodes 220 as well as dielectric layers 214 and 215, as illustrated in FIG. 14.

Figure 14:
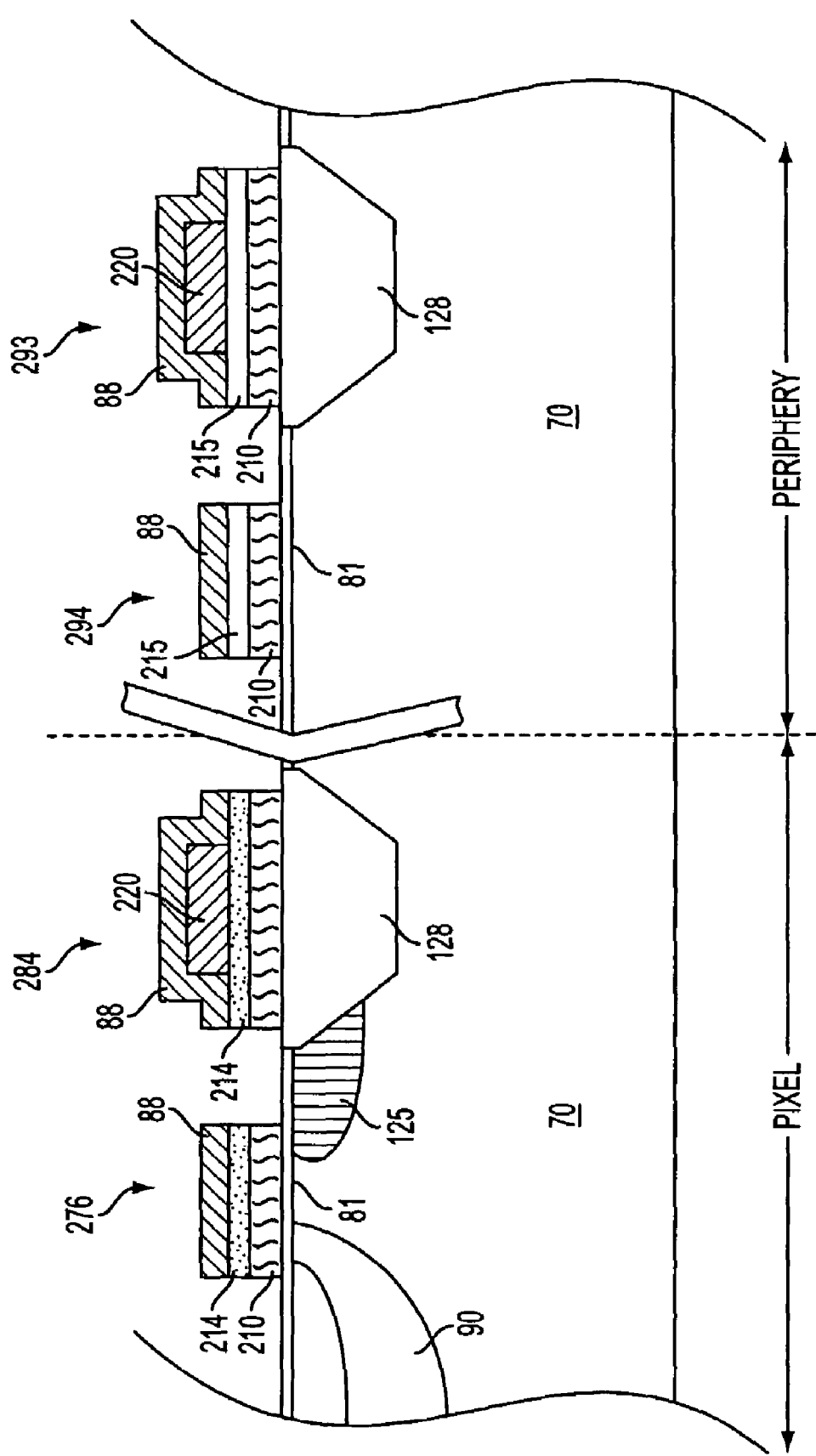
FIG. 14 is a schematic cross-sectional view of the structure of FIG. 10 at a stage of processing subsequent to that shown in FIG. 13.

After selective etching and patterning of layers 210, 214, 215 and of insulating layer 88, the resulting pixel transistor 276, pixel capacitor 284, periphery transistor 294, and periphery capacitor 293 are formed, as shown in FIG. 14. The periphery capacitor 293 comprises a single dielectric 215, whereas the pixel capacitor 284 comprises a single dielectric 214, which is different from the dielectric 215. Alternatively, the periphery capacitor 293 may be formed of two or more dielectrics and the pixel capacitor 284 may be formed of two or more different dielectrics.

An elevated-temperature drive step may also be performed, after which the N and P-channel devices shown in FIG. 14 are fully formed. The structures shown in FIG. 14 may also be covered with a number of translucent or transparent insulating and passivation layers (not shown) formed over the image device. Conventional processing steps may also be carried out to form, for example, contacts in the insulating layers to provide electrical connection with implanted source/drain regions and other wiring to connect gate lines and other connections in the pixel.

Figure 15:
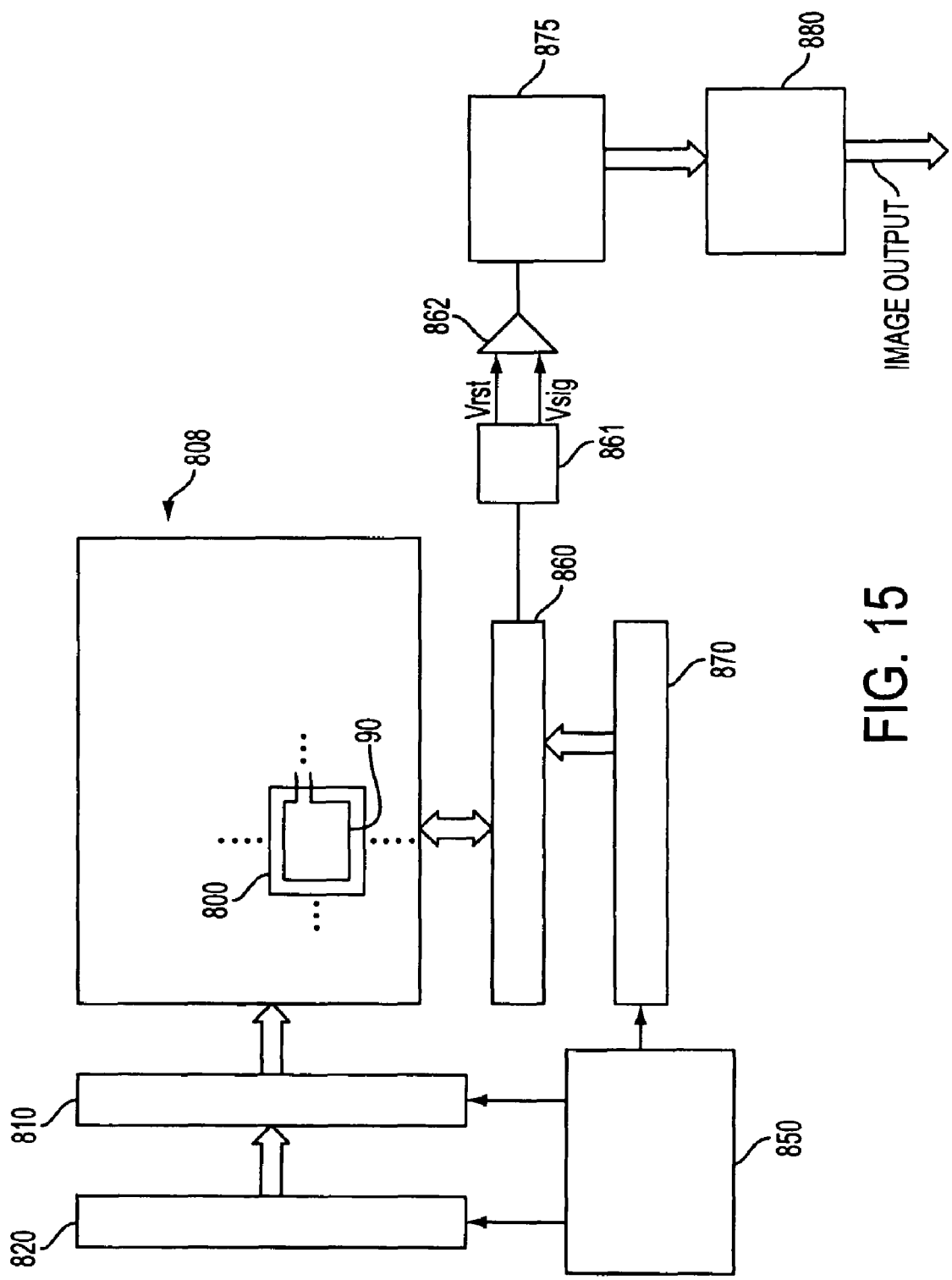
FIG. 15 illustrates a block diagram of a CMOS imager device having a pixel array, wherein the imager device may be combined with a processor in a single integrated circuit fabricated according to the present invention.

FIG. 15 illustrates a block diagram of a CMOS imager device 808 having a pixel array 800 containing a plurality of pixels arranged in rows and columns. The pixels of each row in array 800 are all turned on at the same time by a row select line, and the pixels of each column are selectively output by respective column select lines. The row lines are selectively activated by a row driver 810 in response to row address decoder 820. The column select lines are selectively activated by a column selector 860 in response to column address decoder 870. The pixel array is operated by the timing and control circuit 850, which controls address decoders 820, 870 for selecting the appropriate row and column lines for pixel signal readout. The pixel column signals, which typically include a pixel reset signal ($V_{rst}$)

and a pixel image signal ($V_{sig}$), are read by a sample and hold circuit 881 associated with the column selector 860. A differential signal ($V_{rst}$-$V_{sig}$) is produced by differential amplifier 862 for each pixel which is amplified and digitized by analog to digital converter 875 (ADC). The analog to digital converter 875 supplies the digitized pixel signals to an image processor 880 which forms a digital image. Image processor 880 may include circuits for signal amplification, row addressing, column addressing, white balance, color correction, image correction, and defect correction.

Figure 16:
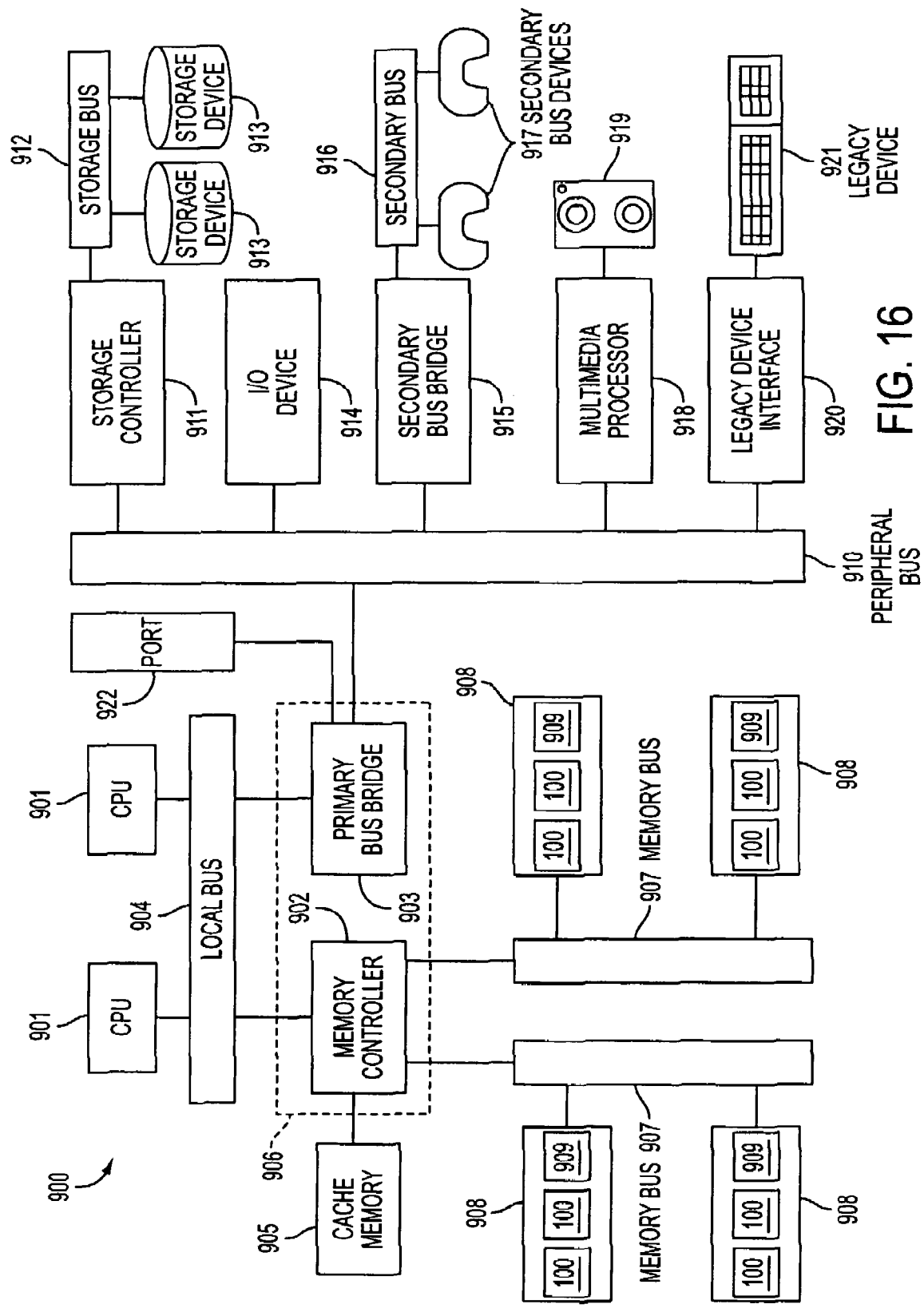
FIG. 16 illustrates a schematic diagram of a computer processor system which may utilize an imaging device, for example, a CMOS imaging device constructed in accordance with one embodiment of the invention.

If desired, the imaging device 808 described above with respect to FIG. 15 may be combined with a processor in a single integrated circuit. FIG. 16 illustrates an exemplary processing system 900 which may utilize an imaging device, for example, a CMOS imager 808 incorporating an imaging device constructed in accordance with embodiments of the invention illustrated in FIGS. 2–14. Any one of the electronic components shown in FIG. 16, including CPU 901, may be fabricated as an integrated circuit for use in processing images formed in accordance with the imager and methods of the present invention.

As illustrated in FIG. 16, the processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also be coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 16 is only an exemplary processing system with which the invention may be used. While FIG. 16 illustrates a processing architecture especially suitable for a general purpose computer, such as a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, and digital cameras and/or recorders. The CMOS imager devices of the present invention, when coupled to a pixel processor, for example, may be implemented in digital cameras and video processors and recorders. Modifications may include, for example, elimination of unnecessary components, addition of specialized devices or circuits, and/or integration of a plurality of devices.

While the invention is preferably directed to methods for forming imager devices with distinct pixel capacitors and periphery capacitors, and structures incorporating such pixel capacitors and periphery capacitors, one skilled in the art will recognize that the invention can be used to form any type of imager device for integration with one or more processing components in a semiconductor device. For example, although the invention is described above for use in a CMOS image sensor, the invention is not limited to such and may be used in any suitable image sensor, for example, CCD image sensors.

The last (output) stage of a CCD image sensor provides sequential pixel signals as output signals, and uses a floating diffusion node, source follower transistor, and reset gate in a similar manner to the way these elements are used in the pixel of a CMOS imager. Accordingly, the pixels formed using the capacitors of the present invention may be employed in CCD image sensors as well as CMOS image sensors. The imager devices of the present invention may also be formed as different size megapixel imagers, for example imagers having arrays in the range of about 0.1 megapixels to about 20 megapixels.

It should again be noted that although the invention has been described with specific reference to imaging devices comprising distinct pixel capacitors and periphery capacitors, the invention has broader applicability and may be used in any imaging apparatus. Similarly, the processes described above are but a few of many that may be used. The above description and drawings illustrate preferred embodiments which achieve the objects, features and advantages of the present invention. Although certain advantages and preferred embodiments have been described above, those skilled in the art will recognize that substitutions, additions, deletions, modifications and/or other changes may be made

What is claimed as new and desired to be protected by Letters Patent of the United States is:

1. A method of forming an imaging device comprising the steps of:
   forming at least one in-pixel photosensor; and
   forming an in-pixel capacitor in a pixel containing said photosensor and at least one periphery capacitor in a region outside of a pixel array, said in-pixel and periphery capacitors being formed at the same time using the same process steps, said process steps comprising:
      forming a first electrode layer over a substrate in a pixel region and a periphery region;
      forming a first dielectric layer over said first electrode layer;
      forming a second dielectric layer over said first dielectric layer; and
      forming a second electrode layer over said second dielectric layer.

2. The method of claim 1, wherein said first electrode layer is formed of a material selected from the group consisting of a poly, poly/WSi, poly/WN/W, poly/silicide, poly/metal and metal.

3. The method of claim 1, wherein said first dielectric layer and said second dielectric layer are formed of a material independently selected from the group consisting of an oxide, nitride, $Al_2O_3$, $Ta_2O_5$, BST, metal oxide and $HfO_x$.

4. The method of claim 1, wherein said second electrode layer is formed of a material selected from the group consisting of a polysilicon, poly/$TiSi_2$, poly/$WSi_2$, poly/$WN_x$/W, poly/$WN_x$, poly/$CoSi_2$, poly/$MoSi_2$, poly/metal and metal.

5. The method of claim 1, wherein said photosensor is one of a photodiode, photogate or photoconductor.

6. The method of claim 5, wherein said photodiode is a p-n-p photodiode.

7. A method of forming an imaging device having both single dielectric capacitors and dual dielectric capacitors, the method comprising the steps of:
   forming at least one photosensor in a pixel region;
   forming a first electrode layer over a substrate in said pixel region and a periphery region which is outside of said pixel region;
   forming a first dielectric layer over said first electrode layer;
   forming a second dielectric layer over said first dielectric layer;
   removing said second dielectric layer in one of said pixel region and said periphery region; and
   patterning a second electrode layer in said pixel region and said periphery region, such that one of said pixel region and said periphery region comprises said first dielectric layer, and the other of said pixel region and said periphery region comprises both said first dielectric layer and said second dielectric layer.

8. The method of claim 7, wherein said first dielectric layer is different from said second dielectric layer.

9. The method of claim 7, wherein said first electrode layer is formed of a material selected from the group consisting of a poly, poly/WSi, poly/WN/W, poly/silicide, poly/metal and metal.

10. The method of claim 7, wherein said first dielectric layer and said second dielectric layer are formed of a material independently selected from the group consisting of an oxide, nitride, $Al_2O_3$, $Ta_2O_5$, BST, metal oxide and $HfO_x$.

11. The method of claim 7, wherein said second electrode layer is formed of a material selected from the group consisting of a polysilicon, poly/$TiSi_2$, poly/$WSi_2$, poly/$WN_x$/W, poly/$WN_x$, poly/$CoSi_2$, poly/$MoSi_2$, poly/metal and metal.

12. The method of claim 7, wherein said photosensor is one of a photodiode, photogate, or photoconductor.

13. The method of claim 12, wherein said photodiode is a p-n-p photodiode.

14. The method of claim 7, wherein removing said second dielectric layer comprises a photoresist masking process.

15. The method of claim 7, wherein removing said second dielectric layer comprises a wet or dry etch process.

16. The method of claim 7, wherein removing said second dielectric layer comprises removing said second dielectric from said pixel region.

17. The method of claim 7, wherein removing said second dielectric layer comprises removing said second dielectric from said periphery region.

18. A method of forming an imaging device comprising the steps of:
   forming at least one in-pixel photosensor; and
   forming an in-pixel capacitor in a pixel containing said photosensor and at least one periphery capacitor in a region outside a pixel array, said in-pixel and periphery capacitors being formed at the same time using the same process steps, said process steps comprising:
      forming a first electrode layer over a substrate in a pixel region and a periphery region;
      forming a dielectric layer over said first electrode layer; and
      forming a second electrode layer over said dielectric layer.

19. The method of claim 18, wherein said first electrode layer is formed of a material selected from the group consisting of a poly, poly/WSi, poly/WN/W, poly/silicide, poly/metal and metal.

20. The method of claim 18, wherein said dielectric layer is formed of a material selected from the group consisting of an oxide, nitride, $Al_2O_3$, $Ta_2O_5$, BST, metal oxide and $HfO_x$.

21. The method of claim 18, wherein said second electrode layer is formed of a material selected from the group consisting of a polysilicon, poly/$TiSi_2$, poly/$WSi_2$, poly/$WN_x$/W, poly/$WN_x$, poly/$CoSi_2$, poly/$MoSi_2$, poly/metal and metal.

22. The method of claim 18, wherein said photosensor is one of a photodiode, photogate or photoconductor.

23. The method of claim 21, wherein said photodiode is a p-n-p photodiode.

* * * * *